(12) United States Patent
Lee et al.

(10) Patent No.: US 7,180,365 B2
(45) Date of Patent: Feb. 20, 2007

(54) CLASS D AMPLIFIER AND A METHOD OF PULSE WIDTH MODULATION

(75) Inventors: Jae-Wook Lee, Seoul (KR); Goog-Chun Cho, Gunpo-si (KR)

(73) Assignees: Samsung Electronics Co., Ltd. (KR); Digital and Analog Co., Ltd. (KR)

( * ) Notice: Subject to any disclaimer, the term of this patent is extended or adjusted under 35 U.S.C. 154(b) by 141 days.

(21) Appl. No.: 11/124,530

(22) Filed: May 6, 2005

(65) Prior Publication Data
US 2005/0264350 A1 Dec. 1, 2005

(30) Foreign Application Priority Data
May 27, 2004 (KR) .................. 10-2004-0037778

(51) Int. Cl.
*H03F 3/38* (2006.01)
(52) U.S. Cl. .................. 330/10; 330/251; 330/207 A
(58) Field of Classification Search .................. 330/10, 330/251, 207 A
See application file for complete search history.

(56) References Cited

U.S. PATENT DOCUMENTS

| 3,991,265 | A | * | 11/1976 | Fukuda et al. .............. 386/104 |
| 5,008,675 | A | | 4/1991 | Toyomaki |
| 5,148,168 | A | | 9/1992 | Masuda et al. |
| 5,617,058 | A | * | 4/1997 | Adrian et al. .................. 330/10 |
| 5,901,176 | A | | 5/1999 | Lewison |
| 6,593,807 | B2 | * | 7/2003 | Groves et al. ................. 330/10 |
| 7,109,789 | B2 | * | 9/2006 | Spencer ........................ 330/10 |
| 2006/0103458 | A1 | * | 5/2006 | Hansen et al. ................. 330/10 |

FOREIGN PATENT DOCUMENTS

| JP | 11-261347 | 9/1999 |
| KR | 1020030097020 A | 12/2003 |

* cited by examiner

*Primary Examiner*—Patricia Nguyen
(74) *Attorney, Agent, or Firm*—F. Chau & Associates, LLC (57) ABSTRACT

A class D amplifier and a method of pulse width modulation are provided. The class D amplifier includes a sigma delta modulator, a reference signal generator, a pulse width modulator and an amplifier. The sigma delta modulator converts an M bit input signal into N bit pulse code modulation data (M and N are integers and M>N). The reference signal generator counts a system clock and generates an N bit reference signal having $2^N$ data blocks in a sampling period of the pulse code modulation data. The pulse width modulator generates a plurality of pulse width modulation signals having at least two switching periods within the sampling period of the pulse code modulation data. The pulse width modulation signals have pulse widths varied based on a unit time interval of the reference signal. The unit time interval corresponds to one of the data blocks of the reference signal.

26 Claims, 5 Drawing Sheets

CLASS D AMPLIFIER AND A METHOD OF PULSE WIDTH MODULATION

CROSS-REFERENCE TO RELATED APPLICATION

This application claims priority under 35 USC § 119 to Korean Patent Application No. 2004-37778, filed on May 27, 2004, the contents of which are herein incorporated by reference in their entirety.

1. Technical Field

The present invention relates to a class D amplifier, and more particularly, to a pulse width modulation circuit for use in the class D amplifier and a pulse width modulation method thereof.

2. Description of the Related Art

A class D amplifier generally performs pulse width modulation to generate a pulse width modulation signal having a pulse width corresponding to an input data value. The class D amplifier is typically used to amplify and transmit audio signals. For example, an input audio signal in digital data format is processed by a digital signal processor (DSP), and then pulse width modulated. The pulse width modulated input audio signal is amplified to be generated in the pulse width modulation signal. Such a pulse width modulation signal is generated based on a pulse code modulation signal, where pulse code modulation is a process of quantizing an analog signal to transform the quantized signal into a binary code sequence whose bit number is the same as a bit number of a corresponding quantification level.

Figure 1:
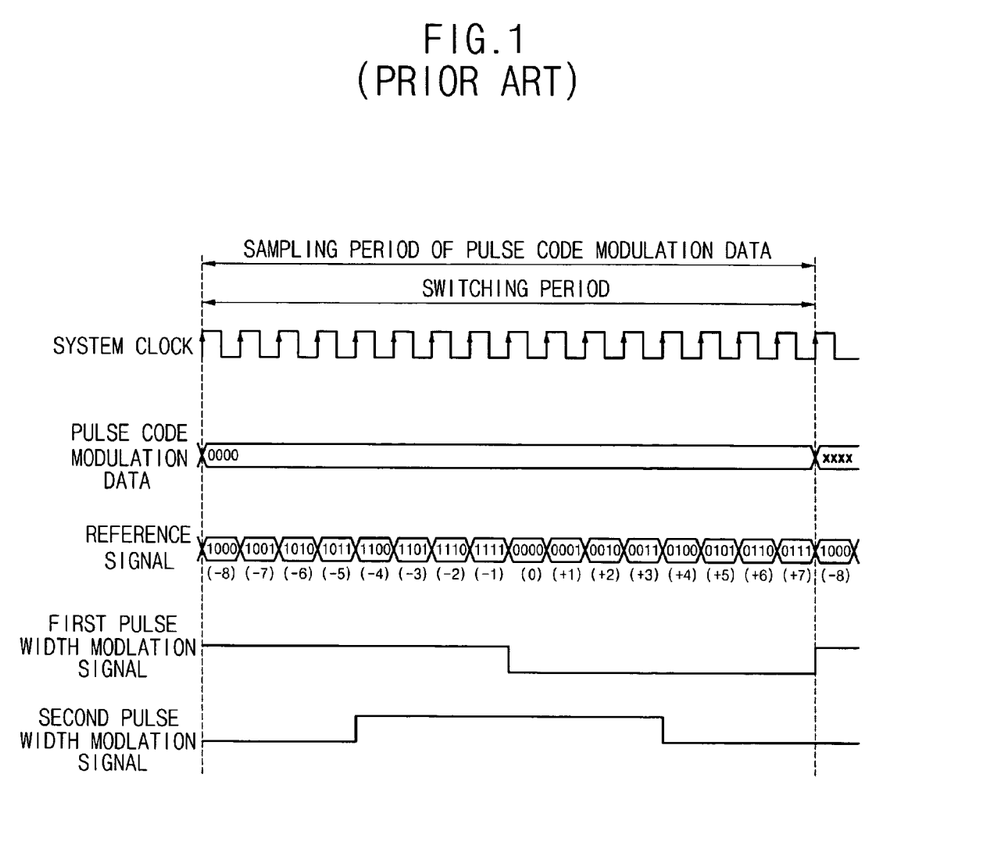
FIG. 1 is a timing diagram illustrating a conventional pulse width modulation method.

FIG. 1 is an exemplary timing diagram illustrating a conventional pulse width modulation method. Referring to FIG. 1, pulse code modulation data is synchronized with a system clock to be generated. The pulse code modulation data has four bits that are obtained by converting an inputted pulse code modulation signal into the pulse code modulation data by a sigma delta modulation.

The system clock is counted and a reference signal is outputted based on the counted system clock. The reference signal has a plurality of data blocks, which respectively have data value ranges from −8 to +7 in decimals. A pulse width modulation signal is generated based on the reference signal and the pulse code modulation data. The pulse width modulation signal is synchronized with the reference signal. A pulse width or a duty ratio of the pulse width modulation signal varies with the pulse code modulation data.

As further shown in FIG. 1, a first pulse width modulation signal and a second pulse width modulation signal each have one switching period within one sampling period of the pulse code modulation data.

The first pulse width modulation signal has only one switching point when the first pulse width modulation signal changes from a high logic level to a low logic level. In other words, the first pulse width modulation signal maintains a high logic level during a first half of a sampling period of the pulse code modulation data and maintains a low logic level during a second half of the sampling period of the pulse code modulation data.

The second pulse width modulation signal has a waveform that is symmetrical with respect to a center of the sampling period of the pulse code modulation data. In other words, the second pulse width modulation signal has two predetermined switching points. The second pulse width modulation signal changes from a low logic level to a high logic level at a first switching point and changes from a high logic level to a low logic level at a second switching point that is symmetrical to the first switching point with respect to the center of the sampling period of the pulse code modulation data.

Because only one pulse width modulation signal is generated during the sampling period of the pulse code modulation data, the pulse width modulation signal may have many harmonic frequency components. These harmonic frequency components may not be completely removed by a low pass filter. Therefore, a signal to noise ratio (SNR) and a total harmonic distortion (THD) of the class D amplifier for use in the conventional pulse width modulation method may not be optimized.

Figure 2:
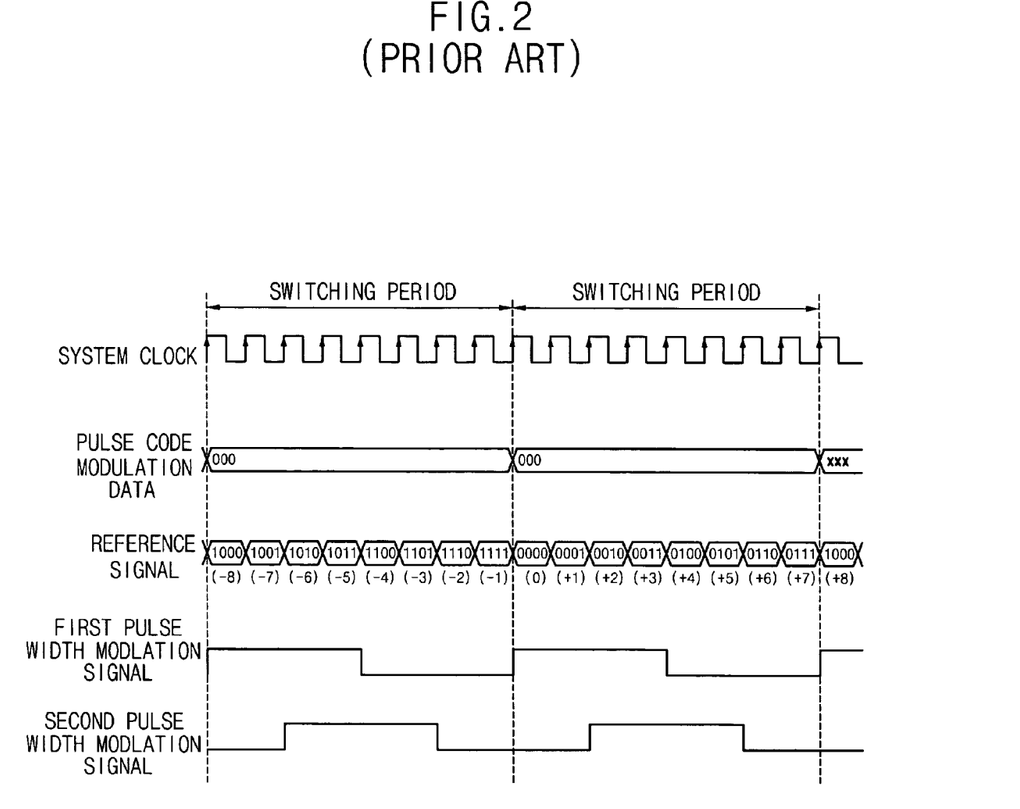
FIG. 2 is a timing diagram illustrating another conventional pulse width modulation method.

FIG. 2 is another exemplary timing diagram illustrating the conventional pulse width modulation method. Referring to FIG. 2, when the system clock has the same clock frequency as that of FIG. 1, a switching frequency of the pulse width modulation signal is doubled. In this case, a counted value of the system clock in one switching period of the pulse width modulation signal is reduced to half the counted value of the system clock in FIG. 1. Therefore, a bit number of the pulse code modulation data is reduced from four bits to three bits. When the bit number of the pulse width modulation signal is reduced, a quantification error in the sigma delta modulation is increased so that the accuracy of the class D amplifier may be deteriorated.

U.S. Pat. No. 5,148,168 discloses another pulse width modulation method that generates two pulse width modulation signals within one sampling period of input digital data. The pulse width modulation method of U.S. Pat. No. 5,148,168 is for use with digital-to-analog conversion techniques. According to U.S. Pat. No. 5,148,168, the pulse width modulation signals each have a waveform that is symmetrical with respect to a center of the sampling period; however, the two pulses of the pulse width modulation signals are apart from the center of the sampling period by N×Tu/2 where Tu represents a unit pulse width and N is a natural number.

SUMMARY OF THE INVENTION

In an exemplary embodiment of the present invention, the class D amplifier includes: a sigma delta modulator configured to convert an M-bit input signal into N-bit pulse code modulation data, wherein M and N are natural numbers and M is greater than N; a reference signal generator configured to count a system clock, and configured to generate an N-bit reference signal having $2^N$ data blocks in one sampling period of the pulse code modulation data; and a pulse width modulator configured to generate a plurality of pulse width modulation signals having at least two switching periods within the one sampling period of the pulse code modulation data, the plurality of pulse width modulation signals having pulse widths that are varied based on a unit time interval of the reference signal, the unit time interval corresponding to one data block of the reference signal.

In another exemplary embodiment of the present invention, the pulse width modulation method includes: converting an M-bit input signal into N-bit pulse code modulation data, wherein M and N are integers and M is greater than N; counting a system clock to generate an N-bit reference signal having $2^N$ data blocks in one sampling period of the pulse code modulation data; and generating a plurality of pulse width modulation signals having at least two switching periods in the one sampling period of the pulse code modulation data, the pulse width modulation signals having pulse widths that are varied based on a unit time interval of the reference signal, the unit time interval corresponding to one data block of the reference signal.

BRIEF DESCRIPTION OF THE DRAWINGS

The present invention will become more apparent to those of ordinary skill in the art by describing, in detail, exemplary embodiments thereof with reference to the attached drawings, wherein like elements are represented by like reference numerals, which are given by way of illustration and thus do not limit the exemplary embodiments of the present invention.

DESCRIPTION OF EXEMPLARY EMBODIMENTS

Figure 3:
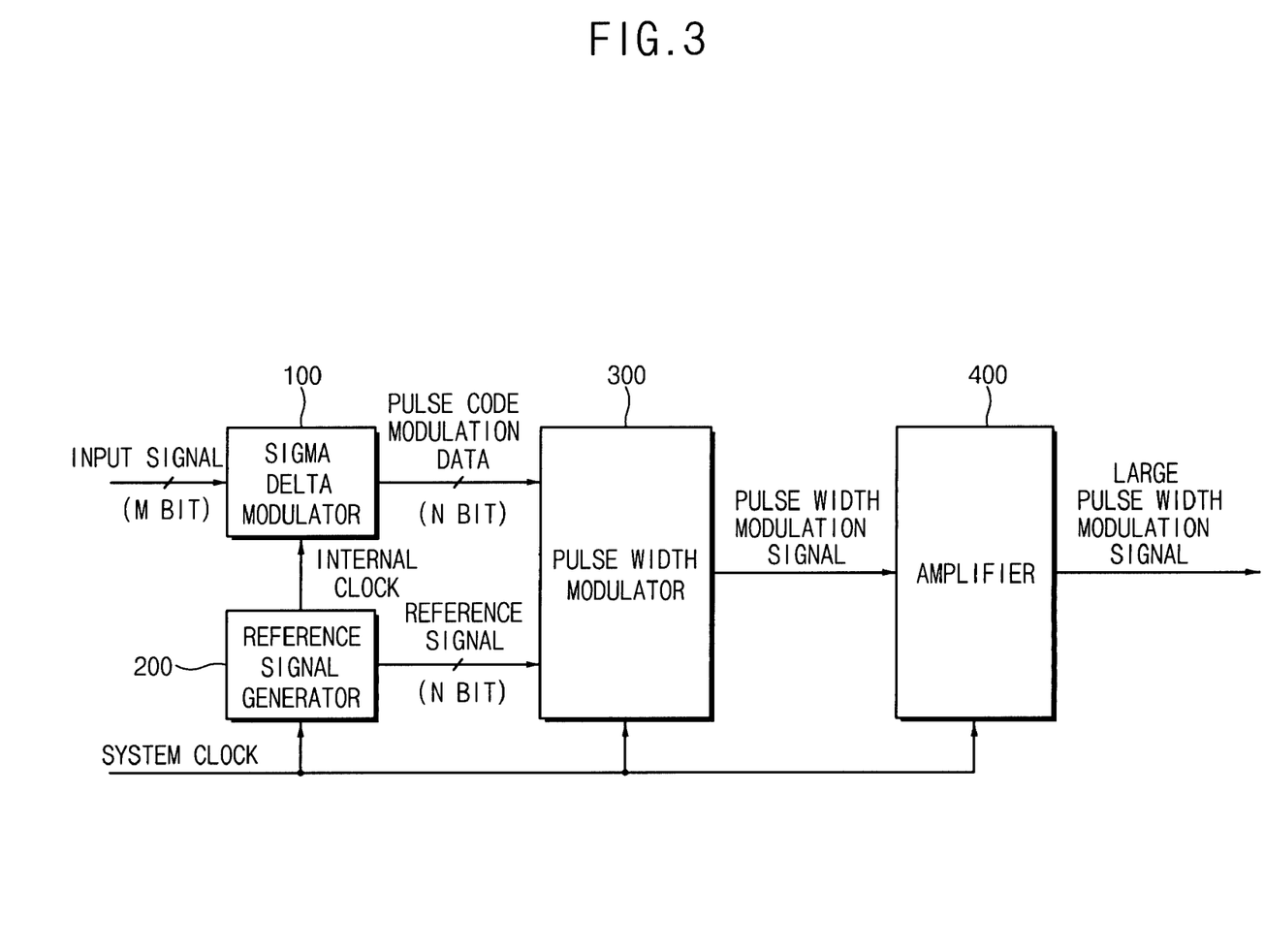
FIG. 3 is a block diagram illustrating a class D amplifier according to an exemplary embodiment of the present invention.

FIG. 3 is a block diagram illustrating a class D amplifier according to an exemplary embodiment of the present invention. Referring to FIG. 3, the class D amplifier includes a sigma delta modulator 100, a reference signal generator 200, a pulse width modulator 300 and an amplifier 400.

The sigma delta modulator 100 receives an M-bit input signal and converts the M-bit input signal into N-bit pulse code modulation data, wherein N is less than M where M and N are natural numbers. A noise component in an audio frequency band of the input signal is removed during sigma delta modulation by the sigma delta modulator 100.

The reference signal generator 200 counts the system clock and produces a reference signal based on a count value of the system clock. The reference signal generator 200 may provide the sigma delta modulator 100 with an internal clock that is used for the sigma delta modulation. The internal clock is applied to the sigma delta modulator 100, and is used to determine the sampling period of the pulse code modulation data outputted from the sigma delta modulator 100. In addition, the reference signal has the same number of bits as the pulse code modulation data, thus the reference signal has $2^N$ data blocks in one sampling period of the pulse code modulation data. For example, when the reference signal and the pulse code modulation data have four bits, the reference signal has $2^4$ data blocks in one sampling period of the pulse code modulation data.

The pulse width modulator 300 generates a pulse width modulation signal having two switching periods within one sampling period of the pulse code modulation data. The pulse width modulation signal is synchronized with the reference signal to be outputted. Particularly, the outputted pulse width modulation signal has a predetermined level and the pulse width (or duty cycle) of the outputted pulse width modulation signal is adjusted by each bit of the pulse code modulation data. For example, the pulse width (or duty cycle) of the outputted pulse width modulation signal is increased or decreased by an amount corresponding to k×unit time interval ($T_f$) (where k is a natural number) based on a value of a binary digit location of the pulse code modulation data. The amplifier 400 then amplifies the pulse width modulation signal by a predetermined gain and outputs a large pulse width modulation signal.

Figure 4:
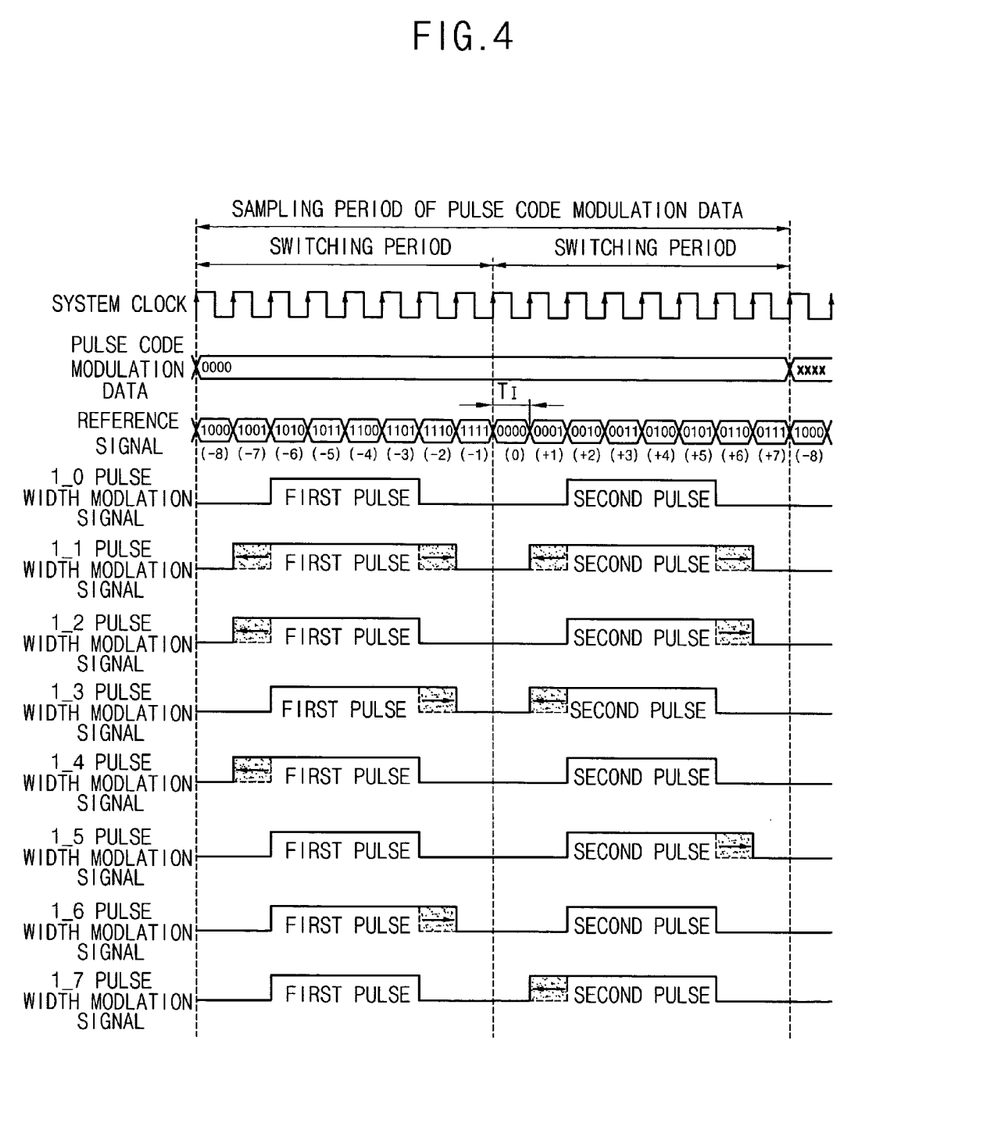
FIGS. 4 and 5 are timing diagrams illustrating an operation of a class D amplifier according to an exemplary embodiment of the present invention.
Figure 5:
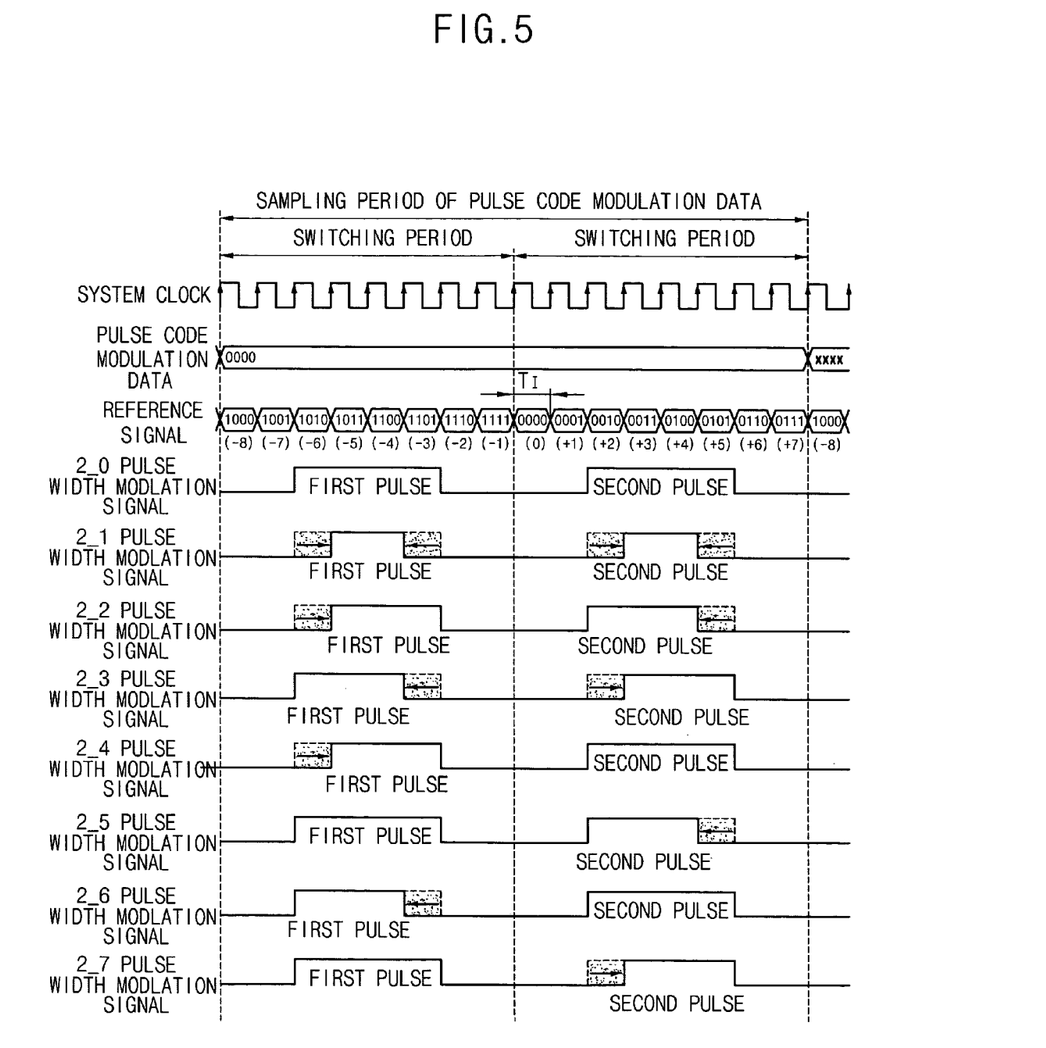

FIG. 4 and FIG. 5 are timing diagrams illustrating the operation of a class D amplifier according to an exemplary embodiment of the present invention. For illustrative purposes, the pulse code modulation data and the reference signal have four bits.

FIG. 4 illustrates the pulse width modulation signals when the pulse code modulation data has a positive decimal value. As shown in FIG. 4, the reference signal has $2^4$ data blocks (e.g., 16 data blocks) within one sampling period of the pulse code modulation data. A data block of the reference signal corresponds to one unit time interval ($T_f$). Therefore, the pulse code modulation data has one sampling period corresponding to the 16 data blocks of the reference signal and is synchronized with the reference signal.

Pulse width modulation signals have two switching periods according to the pulse code modulation data generated by the sigma delta modulation. Thus, the pulse width modulation signal has a first pulse and a second pulse. When the pulse code modulation data equals a binary value "0000", a 1_0 pulse width modulation signal as shown in FIG. 4 is generated. The first pulse of the 1_0 pulse width modulation signal has a duty cycle of about 50% and the second pulse also has a duty cycle of about 50%. The first and second pulses are synchronized with the reference signal. Particularly, the pulses are generated in synchronization with a time point where the data of the reference signal changes. Alternatively, when the pulse code modulation data equals the binary value "0000", the duty cycle of the first or second pulse may be above 50% or below 50%.

When a bit value in a four's column (e.g., the third bit from the least significant right bit) of the pulse code modulation data equals a binary value '1', the pulse widths of the first and second pulses are increased by an amount corresponding to four unit time intervals ($4T_f$) as shown in a 1_1 pulse width modulation signal. The pulse width of the first pulse of the 1_1 pulse width modulation signal may increase by an amount corresponding to two unit time intervals ($2T_f$) of the reference signal in right and left directions as compared to the pulse width of the first pulse of the 1_0 pulse width modulation signal. In other words, the pulse width of the first pulse of the 1_1 pulse width modulation signal increases by one unit time interval ($T_f$) of the reference signal to the left and by an amount corresponding to one unit time interval ($T_f$) of the reference signal to the right. The pulse width of the second pulse of the 1_1 pulse width modulation signal is also increased in the same way as the first pulse of the 1_1 pulse width modulation signal.

When a bit value in a two's column of the pulse code modulation data equals a binary value '1', the pulse width modulation signal may have two types of pulse width modulation signals such as a 1_2 pulse width modulation signal and a 1_3 pulse width modulation signal as shown in FIG. 4. Either the 1_2 pulse width modulation signal or the 1_3 pulse width modulation signal has a pulse width increased by an amount corresponding to two unit time intervals ($2T_f$).

The pulse width of the first pulse of the 1_2 pulse width modulation signal increases by an amount corresponding to one unit time interval ($T_f$) to the left. In addition, the pulse width of the second pulse of the 1_2 pulse width modulation signal increases by an amount corresponding to one unit time interval ($T_f$) to the right. Therefore, the first and second pulses of the 1_2 pulse width modulation signal are symmetrical with respect to a center of the sampling period of the pulse code modulation data.

The pulse width of the first pulse of the 1_3 pulse width modulation signal increases by an amount corresponding to one unit time interval ($T_I$) to the right and the pulse width of the second pulse of the 1_3 pulse width modulation signal increases by an amount corresponding to one unit time interval ($T_I$) to the left. Therefore, the first and second pulses of the 1_3 pulse width modulation signal increase by an amount corresponding to one unit time interval ($T_I$) in a direction toward the center of the sampling period of the pulse code modulation data. Thus, the first and second pulses of the 1_3 pulse width modulation signal are symmetrical with respect to the center of the sampling period of the pulse code modulation data.

When a bit value in a one's column of the pulse code modulation data equals a binary value '1', the pulse width modulation signal may have four types of pulse width modulation signals such as a 1_4 pulse width modulation signal through a 1_7 pulse width modulation signal as shown in FIG. 4.

The 1_4 pulse width modulation signal has a first pulse whose pulse width is increased by an amount corresponding to one unit time interval ($T_I$) of the reference signal to the left.

The 1_5 pulse width modulation signal has a second pulse whose pulse width is increased by an amount corresponding to one unit time interval ($T_I$) of the reference signal to the right. The pulse width of the 1_5 pulse width modulation signal is increased in a direction opposite to a direction in which the pulse width of the 1_4 pulse width modulation signal is increased.

The 1_6 pulse width modulation signal has a first pulse whose pulse width is increased by an amount corresponding to one unit time interval ($T_I$) of the reference signal to the right.

The 1_7 pulse width modulation signal has a second pulse whose pulse width is increased by an amount corresponding to one unit time interval ($T_I$) of the reference signal to the left. The pulse width of the 1_7 pulse width modulation signal is increased in a direction opposite to a direction in which the pulse width of the 1_6 pulse width modulation signal is increased.

When the bit value in the one's column of the pulse code modulation data equals a binary value '1', any one of the 1_4 through 1_7 pulse width modulation signals may be selected and outputted. When another pulse code modulation data having a binary value '1' in its one's column is provided after a previous pulse code modulation data, one of the first pulse and the second pulse that is previously unselected is selected and a pulse width of the selected pulse is increased in a direction opposite to a direction in which the pulse width of the previously selected pulse is increased.

For example, when the bit value in the one's column of a first pulse code modulation data equals a binary value '1', the 1_4 pulse width modulation signal is generated. The 1_5 pulse width modulation signal is generated when the bit value in the one's column of a successive second pulse code modulation data equals a binary value '1'. In addition, when the bit value in the one's column of a successive third pulse code modulation data equals a binary value '1', the 1_6 pulse width modulation signal is generated, and the 1_7 pulse width modulation signal is generated when a bit value in the one's column of a successive fourth pulse code modulation data also equals a binary value '1'.

Thus, whenever the bit value in the one's column of the pulse code modulation data equals a binary value '1', the 1_4 pulse width modulation signal, 1_5 pulse width modulation signal, 1_6 pulse width modulation signal and 1_7 pulse width modulation signal may be generated so that symmetrical pulse width modulation signals may be obtained on the average during four sampling periods of the pulse width modulation data.

In addition, an initial pulse width modulation signal that is generated may be randomly selected among the 1_4, 1_5, 1_6 and 1_7 pulse width modulation signals. Thus, referring to FIG. 5, the pulse width modulation signals are generated based on pulse code modulation data whose decimal value is negative (e.g., a sign bit of the pulse code modulation data is a binary value '1').

Because the reference signal has $2^4$ data blocks, e.g., 16 data blocks, within the sampling period of the pulse code modulation data, the pulse code modulation data has one sampling period corresponding to the 16 data blocks of the reference signal and is synchronized to the reference signal.

The pulse width modulation signals have two switching periods according to the pulse code modulation data generated by the sigma delta modulation. Thus, the pulse width modulation signal has a first pulse and a second pulse. When the pulse code modulation data equals a binary value "0000", a 2_0 pulse width modulation signal as shown in FIG. 5 is generated whose first pulse has a duty cycle of about 50% and whose second pulse also has a duty cycle of about 50%. The first and second pulses are synchronized with the reference signal. Particularly, the pulses are generated in synchronization with a time point where the data of the reference signal changes. Alternatively, when the pulse code modulation data equals a binary value "0000", the duty cycle of the first or second pulses may be above 50% or below 50%.

When the sign bit of the pulse code modulation data is a binary value '1' and a bit value in a four's column of the pulse code modulation data equals a binary value '1', the pulse widths of the first and second pulses of a 2_1 pulse width modulation signal are decreased by an amount corresponding to four unit time intervals ($4T_I$) as shown in FIG. 5. The pulse width of the first pulse of the 2_1 pulse width modulation signal may decrease by an amount corresponding to two unit time intervals ($2T_I$) of the reference signal to the right and left directions as compared to the pulse width of the first pulse of the 2_0 pulse width modulation signal. In other words, the pulse width of the first pulse decreases by an amount corresponding to one unit time interval ($T_I$) to the left and decreases by an amount corresponding to one unit time interval ($T_I$) to the right. The pulse width of the second pulse of the 2_1 pulse width modulation signal may also be decreased in the same way as that of the first pulse of the 2_1 pulse width modulation signal.

When the sign bit of the pulse code modulation data is a binary value '1' and a bit value in a two's column of the pulse code modulation data equals a binary value '1', the pulse width modulation signal may have two types of pulse width modulation signals such as a 2_2 pulse width modulation signal and a 2_3 pulse width modulation signal as shown in FIG. 5. Either the 2_2 pulse width modulation signal or the 2_3 pulse width modulation signal has a decreased pulse width by an amount corresponding to one unit time interval ($T_I$) when the bit value in the two's column of the pulse code modulation data equals a binary value '1'.

With regard to the 2_2 pulse width modulation signal, the pulse width of the first pulse of the 2_2 pulse width modulation signal decreases by an amount corresponding to one unit time interval ($T_I$) of the reference signal to the right. In addition, the pulse width of the second pulse of the 2_2 pulse width modulation signal decreases by an amount corresponding to one unit time interval ($T_I$) of the reference signal to the left. Therefore, the first and second pulses of the 2_2 pulse width modulation signal are symmetrical with respect to the center of the sampling period of the pulse code modulation data.

With regard to the 2_3 pulse width modulation signal, the pulse width of the first pulse of the 2_3 pulse width modulation signal decreases by an amount corresponding to one unit time interval ($T_I$) of the reference signal to the left. In addition, the pulse width of the second pulse of the 2_3 pulse width modulation signal decreases by an amount corresponding to one unit time interval ($T_I$) of the reference signal to the right. Therefore, the first and second pulses of the 2_3 pulse width modulation signal are symmetrical with respect to the center of the sampling period of the pulse code modulation data.

When the sign bit of the pulse code modulation data is a binary value '1' and a bit value in a one's column of the pulse code modulation data equals a binary value '1', the pulse width modulation signal may have four types of pulse width modulation signals such as a 2_4 pulse width modulation signal through a 2_7 pulse width modulation signal as shown in FIG. 5.

The 2_4 pulse width modulation signal has a first pulse whose pulse width is decreased by an amount corresponding to one unit time interval ($T_I$) of the reference signal to the right.

The 2_5 pulse width modulation signal has a second pulse whose pulse width is decreased by an amount corresponding to one unit time interval ($T_I$) of the reference signal to the left. The pulse width of the 2_5 pulse width modulation signal is decreased in a direction opposite to a direction in which the pulse width of the 2_4 pulse width modulation signal is decreased.

The 2_6 pulse width modulation signal has a first pulse whose pulse width is decreased by an amount corresponding to one unit time interval ($T_I$) of the reference signal to the left.

The 2_7 pulse width modulation signal has a second pulse whose pulse width is decreased by an amount corresponding to one unit time interval ($T_I$) of the reference signal to the right. The pulse width of the 2_7 pulse width modulation signal is decreased in a direction opposite to a direction in which the 2_6 pulse width modulation signal is decreased.

When the one's column of the pulse code modulation data equals a binary value '1', any one of the 2_4 through 2_7 pulse width modulation signals may be selected and outputted. When the one's column of another pulse code modulation data successive to the pulse code modulation data also equals a binary value '1', one of the first pulse and the second pulse that is previously unselected is selected and a pulse width of the selected pulse decreases in a direction opposite to a direction in which the pulse width of the previously selected pulse is decreased.

For example, when the one's column of a first pulse code modulation data equals a binary value '1', the 2_4 pulse width modulation signal is selected to be generated, and the 2_5 pulse width modulation signal is generated when successive second pulse code modulation data having a binary value '1' in the one's column is provided after the previous first pulse code modulation data. In addition, when the one's column of successive third pulse code modulation data equals a binary value '1', the 2_6 pulse width modulation signal is generated, and the 2_7 pulse width modulation signal is generated when successive fourth pulse code modulation data having a binary value '1' in the one's column is provided after the previous third pulse code modulation data.

Thus, whenever the one's column of the pulse code modulation data equals a binary value '1', the 2_4 pulse width modulation signal, 2_5 pulse width modulation signal, 2_6 pulse width modulation signal and 2_7 pulse width modulation signal are generated so that symmetrical pulse width modulation signals may be obtained on the average during four sampling periods of the pulse width modulation data. In addition, an initial pulse width modulation signal to be generated may be randomly selected.

In addition, when the two's column of the pulse code modulation data equals a binary value '1', either one of the 1_2 pulse width modulation signal and 1_3 pulse width modulation signal as shown in FIG. 4 may be selected and generated. The remaining pulse width modulation signal except the previously selected pulse width modulation signal may be selected based on a value of a binary digit location of the pulse code modulation data. The 2_2 pulse width modulation signal and 2_3 pulse width modulation signal as shown in FIG. 5 may be selected in such a manner.

Further, although the exemplary embodiments discuss the pulse width modulation signal having two pulses and two switching periods within one sampling period of the pulse code modulation data, the pulse width modulation signal could include more than two pulses. For example, the pulse width modulation signal may include four pulses, eight pulses or sixteen pulses, etc., within one sampling period of the pulse code modulation data. In addition, the number of the pulses may be adjusted according to the number of the unit time intervals ($T_I$) of the reference signal.

According to an exemplary embodiment of the present invention, a pulse width modulation signal has at least two switching periods within one sampling period of the pulse code modulation data. Symmetrical pulse width modulation signals may be obtained on the average during sampling periods of the pulse width modulation data. Therefore, harmonic frequencies of the pulse code modulation data can be removed without increasing the system clock. In addition, a signal to noise ratio (SNR) of the class D amplifier may be improved and a total harmonic distortion (THD) of the class D amplifier may be reduced.

Having thus described exemplary embodiments of the present invention, it is to be understood that the invention defined by the appended claims is not to be limited by particular details set forth in the above description as many apparent variations are possible without departing from the spirit or scope thereof as hereinafter claimed.

What is claimed is:

1. A class D amplifier comprising:
a sigma delta modulator for converting an M-bit input signal into N-bit pulse code modulation data, wherein M and N are natural numbers and M is greater than N;
a reference signal generator for counting a system clock, and for generating an N-bit reference signal having $2^N$ data blocks in a sampling period of the pulse code modulation data; and
a pulse width modulator for generating a plurality of pulse width modulation signals having at least two switching periods within the sampling period of the pulse code modulation data, the plurality of pulse width modulation signals having pulse widths that are varied based on a unit time interval of the reference signal, wherein the unit time interval corresponds to one of the data blocks of the reference signal.

2. The class D amplifier of claim 1, wherein a pulse width of one of the plurality of pulse width modulation signals varies according to a value of a binary digit location of the pulse code modulation data.

3. The class D amplifier of claim 2, wherein when a sign bit of the pulse code modulation data is a binary value '0' one of the plurality of pulse width modulation signals has a first pulse and a second pulse, wherein pulse widths of the first and second pulses are increased by an amount corresponding to four unit time intervals when a bit value in a four's column of the pulse code modulation data equals a binary value '1', wherein the pulse widths of the first and second pulses are increased by an amount corresponding to two unit time intervals when a bit value in a two's column of the pulse code modulation data equals the binary value '1', and wherein a pulse width of one of the first pulse and the second pulse is increased by an amount corresponding to one unit time interval when a bit value in a one's column of the pulse code modulation data equals the binary value '1'.

4. The class D amplifier of claim 3, wherein when the bit value in the four's column of the pulse code modulation data equals the binary value '1', the pulse widths of the first pulse and the second pulse are respectively increased in a first direction by an amount corresponding to the one unit time interval and in a second direction by an amount corresponding to the one unit time interval.

5. The class D amplifier of claim 3, wherein when the bit value in the two's column of the pulse code modulation data equals the binary value '1', the pulse width of the first pulse is increased in a first direction by the amount corresponding to the one unit time interval and the pulse width of the second pulse is increased in a second direction opposite to the first direction by the amount corresponding to the one unit time interval.

6. The class D amplifier of claim 3, wherein when the bit value in the one's column of the pulse code modulation data equals the binary value '1', one of the first pulse and the second pulse is selected and a pulse width of the selected pulse is increased in one of a first direction and in a second direction, the second direction being opposite to the first direction.

7. The class D amplifier of claim 6, wherein when second pulse code modulation data is successive to the pulse code modulation data and a bit value in a one's column of the second pulse code modulation data equals the binary value '1', one of the first pulse and the second pulse that is previously unselected is selected and a pulse width of the selected pulse is increased in a direction opposite to a direction in which the pulse width of a previously selected pulse is increased.

8. The class D amplifier of claim 2, wherein when a sign bit of the pulse code modulation data is a binary value '1' one of the pulse width modulation signals has a first pulse and a second pulse, wherein pulse widths of the first and second pulses are decreased by an amount corresponding to four unit time intervals when a bit value in a four's column of the pulse code modulation data equals a binary value '1', wherein the pulse widths of the first and second pulses are decreased by an amount corresponding to two unit time intervals when a bit value in a two's column of the pulse code modulation data equals the binary value '1', and wherein a pulse width of one of the first pulse and the second pulse is decreased by an amount corresponding to one unit time interval when a bit value of the one's column of the pulse code modulation data equals the binary value '1'.

9. The class D amplifier of claim 8, wherein when the bit value in the four's column of the pulse code modulation data equals the binary value '1', the pulse widths of the first and second pulses respectively are decreased in a first direction by an amount corresponding to the one unit time interval and in a second direction by an amount corresponding to the one unit time interval.

10. The class D amplifier of claim 8, wherein when the bit value in the two's column of the pulse code modulation data equals a binary value '1', the pulse width of the first pulse is decreased in a first direction by the amount corresponding to the one unit time interval and the pulse width of the second pulse is decreased in a second direction opposite to the first direction by the amount corresponding to the one unit time interval.

11. The class D amplifier of claim 8, wherein when the bit value in the one's column of the pulse code modulation data equals the binary value '1', one of the first pulse and the second pulse is selected and a pulse width of the selected pulse is decreased in one of a first direction and in a second direction, the second direction being opposite to the first direction.

12. The class D amplifier of claim 11, wherein when second pulse code modulation data is successive to the pulse code modulation data, a sign bit of the second pulse code modulation data has a binary value '1' and a bit value in a one's column of the second pulse code modulation data equals the binary value '1', one of the first pulse and the second pulse that is previously unselected is selected and a pulse width of the selected pulse is decreased in a direction opposite to a direction in which the pulse width of a previously selected pulse is decreased.

13. The class D amplifier of claim 1, further comprising:
an amplifier for amplifying one of the plurality of pulse width modulation signals.

14. A pulse width modulation method, the method comprising:
converting an M-bit input signal into N-bit pulse code modulation data, wherein M and N are integers and M is greater than N;
counting a system clock to generate an N-bit reference signal having $2^N$ data blocks in a sampling period of the pulse code modulation data; and
generating a plurality of pulse width modulation signals having at least two switching periods in the sampling period of the pulse code modulation data, the plurality of pulse width modulation signals having pulse widths that are varied based on a unit time interval of the reference signal, the unit time interval corresponding to one of the data blocks of the reference signal.

15. The pulse width modulation method of claim 14, wherein a pulse width of one of the plurality of pulse width modulation signals varies according to a value of a binary digit location of the pulse code modulation data.

16. The pulse width modulation method of claim 15, wherein when a sign bit of the pulse code modulation data is a binary value '0', wherein one of the plurality of pulse width modulation signals has a first pulse and a second pulse, wherein pulse widths of the first and second pulses are increased by an amount corresponding to four unit time intervals when a bit value in a four's column of the pulse code modulation data equals a binary value '1', wherein the pulse widths of the first and second pulses are increased by an amount corresponding to two unit time intervals when a bit value in a two's column of the pulse code modulation data equals the binary value '1', and wherein a pulse width of one of the first pulse and the second pulse is increased by an amount corresponding to one unit time interval when a bit value of a one's column of the pulse code modulation data equals the binary value '1'.

17. The pulse width modulation method of claim 16, wherein when the bit value in the four's column of the pulse code modulation data equals the binary value '1', the pulse widths of the first pulse and the second pulse are respectively increased in a first direction by an amount corresponding to the one unit time interval and in a second direction by an amount corresponding to the one unit time interval.

18. The pulse width modulation method of claim 16, wherein when the bit value in the two's column of the pulse code modulation data equals the binary value '1', the pulse width of the first pulse is increased in a first direction by the amount corresponding to the one unit time interval and the pulse width of the second pulse is increased in a second direction opposite to the first direction by the amount corresponding to the one unit time interval.

19. The pulse width modulation method of claim 16, wherein when the bit value in the one's column of the pulse code modulation data equals the binary value '1', one of the first pulse and the second pulse is selected and a pulse width of the selected pulse is increased in one of a first direction and in a second direction, the second direction being opposite to the first direction.

20. The pulse width modulation method of claim 19, wherein when second pulse code modulation data is successive to the pulse code modulation data and a bit value in a one's column of the second pulse code modulation data equals the binary value '1', one of the first pulse and the second pulse that is previously unselected is selected and a pulse width of the selected pulse is increased in a direction opposite to a direction in which the pulse width of a previously selected pulse is increased.

21. The pulse width modulation method of claim 15, wherein when a sign bit of the pulse code modulation data is a binary value '1', one of the plurality of pulse width modulation signals has a first pulse and a second pulse, wherein pulse widths of the first and second pulses are decreased by an amount corresponding to four unit time intervals when a bit value in a four's column of the pulse code modulation data equals a binary value '1', wherein the pulse widths of the first and second pulses are decreased by an amount corresponding to two unit time intervals when a bit value in a two's column of the pulse code modulation data equals the binary value '1', and wherein a pulse width of one of the first pulse and the second pulse is decreased by an amount corresponding to one unit time interval when a bit value in the one's column of the pulse code modulation data equals the binary value '1'.

22. The pulse width modulation method of claim 21, wherein when the bit value in the four's column of the pulse code modulation data equals the binary value '1', the pulse widths of the first and second pulses respectively are decreased in a first direction by an amount corresponding to the one unit time interval and in a second direction by an amount corresponding to the one unit time interval.

23. The pulse width modulation method of claim 21, wherein when the bit value in the two's column of the pulse code modulation data equals a binary value '1', the pulse width of the first pulse is decreased in a first direction by the amount corresponding to the one unit time interval and the pulse width of the second pulse is decreased in a second direction opposite to the first direction by the amount corresponding to the one unit time interval.

24. The pulse width modulation method of claim 21, wherein when the bit value in the one's column of the pulse code modulation data equals the binary value '1', one of the first pulse and the second pulse is selected and a pulse width of the selected pulse is decreased in one of a first direction and in a second direction, the second direction being opposite to the first direction.

25. The pulse width modulation method of claim 24, wherein when second pulse code modulation data is successive to the pulse code modulation data, a sign bit of the second pulse code modulation data has a binary value '1' and a bit value in a one's column of the second pulse code modulation data equals the binary value '1', one of the first pulse and the second pulse that is previously unselected is selected and a pulse width of the selected pulse is decreased in a direction opposite to a direction in which the pulse width of a previously selected pulse is decreased.

26. The pulse width modulation method of claim 14, further comprising:

amplifying one of the plurality of pulse width modulation signals.

* * * * *